United States Patent
Chew et al.

(10) Patent No.: US 7,761,824 B2
(45) Date of Patent: Jul. 20, 2010

(54) SYSTEM AND METHOD TO GENERATE AN IC LAYOUT USING SIMPLIFIED MANUFACTURING RULE

(76) Inventors: Marko P. Chew, 3270 South Ct., Palo Alto, CA (US) 94306; Yue Yang, 8153 Park Villa Cir., Cupertino, CA (US) 95014

( * ) Notice: Subject to any disclaimer, the term of this patent is extended or adjusted under 35 U.S.C. 154(b) by 438 days.

(21) Appl. No.: 11/824,759

(22) Filed: Jul. 2, 2007

(65) Prior Publication Data

US 2008/0244480 A1   Oct. 2, 2008

Related U.S. Application Data

(60) Provisional application No. 60/818,784, filed on Jul. 5, 2006.

(51) Int. Cl.
*G06F 17/50* (2006.01)

(52) U.S. Cl. .................... 716/5; 716/2; 716/8; 716/9

(58) Field of Classification Search ..................... 716/5, 716/8, 9, 2, 11
See application file for complete search history.

(56) References Cited

U.S. PATENT DOCUMENTS

| 6,216,254 | B1 * | 4/2001 | Pesce et al. ..................... 716/5 |
| 6,263,483 | B1 * | 7/2001 | Dupenloup ..................... 716/18 |
| 6,449,749 | B1 * | 9/2002 | Stine .............................. 716/4 |
| 6,901,564 | B2 * | 5/2005 | Stine et al. ..................... 716/4 |
| 2005/0177810 | A1 * | 8/2005 | Heng et al. ................... 716/21 |

\* cited by examiner

*Primary Examiner*—Sun J Lin

(57) ABSTRACT

Some embodiments of the invention provide a system and method where a physical design ("PD") process can use simplified manufacturing rules to generate an integrated circuit ("IC") layout. A layout optimization process transforms the PD generated layout to become more manufacturing rule compliant layout using a full set of manufacturing rules. The invention increases the probability of the PD process successfully generates an IC layout since the PD is not burdened with having to consider the full complexity of the manufacturing rules.

9 Claims, 7 Drawing Sheets

SYSTEM AND METHOD TO GENERATE AN IC LAYOUT USING SIMPLIFIED MANUFACTURING RULE

CLAIM OF BENEFIT TO PROVISIONAL APPLICATION

This patent application claims the benefit of the earlier filed U.S. Provisional Patent Application entitled "System and method to generate an IC layout using simplified manufacturing rules", having Ser. No. 60/818,784 and filed Jul. 5, 2006.

TECHNICAL FIELD OF APPLICATION

This invention relates generally to the design and manufacture of integrated circuit and more particularly to a method for generating an IC layout structures compliant with manufacturing rule requirements.

BACKGROUND OF THE INVENTION

The electronic circuit of an integrated circuit (IC) can be considered to be a graph of connected components such as, but not limited to, transistors and resistors. Such an entity is commonly referred it as a netlist. Each component is mapped to one or more layout objects that are geometrical 2-dimensional objects such as, but not limited to, rectangles, polygons, and paths. In turn, these layout objects are used to define regions within the semiconductor die, which will receive different processing steps such as dopant, implants to produce N-type or P-type regions during the integrated circuit fabrication process.

Every layout object must satisfy manufacturing rules that specify geometrical requirements for each object as well as the relationship of an object to other objects. The manufacturing rules increase the probability that the final IC products will meet product specifications. Examples of such requirements include, but are not limited to, such items as minimum layout object width and minimum spacing from one layout object to that of another.

Ultimately, every IC netlist must be mapped to a layout representation prior to its manufacture. One important goal is minimize the layout area for an IC circuit since it has a direct impact on the eventual product cost while abiding with manufacturing rules.

Design engineers typically use electronic design automation ("EDA") applications to create IC layouts. These applications provide sets of computer-based tools for creating, editing, and analyzing IC design layouts.

EDA applications create layouts from an IC netlist by various operations. Some, but not all, of the physical design ("PD") operations need to transform a netlist to a layout include: (1) placement which specifies the location of the IC components; (2) routing which generates the layout objects used to connect the IC components; (3) addition operations to complete the layout such as, but not limited to adding substrate/well contacts and power/ground routing. The result of the physical design process is an IC layout.

The PD procedure is a very difficult and complicated sequence of processes. The procedure is such a difficult computational problem that a successful generation of an IC layout is not always assured. If any of the steps in a PD process fails, then an IC layout cannot be generated. The procedure is made more onerous since IC manufacturing rules have become very complex and extremely difficult to incorporate into the typical PD without negatively impacting the probability that the PD can successfully generate an IC layout.

SUMMARY OF THE INVENTION

The present invention relates to a method and system consisting of a) physical design ("PD") process using simplified set of manufacturing rules during the generation of an IC layout, and b) layout optimization ("LO") process step to transform an PD generated layout to an optimized IC layout which is more manufacturing rule compliant with a minimal layout area impact.

One advantage of the present invention is that the probability of PD process successfully generating an IC layout is increased since the computational complexity of complying with a complete manufacturing rules is deferred so that a PD process can concentrate on the computationally difficult task of successfully generating an IC layout with a smaller layout area.

DETAILED DESCRIPTION

In the following description, numerous details are set forth for purpose of explanation. However, one of skill in the art will realize that the invention may be practiced with variations of these specific details. In other instances, well-known structures or operations are not shown in detail to avoid obscuring the invention.

Computing Environment

Figure 1:
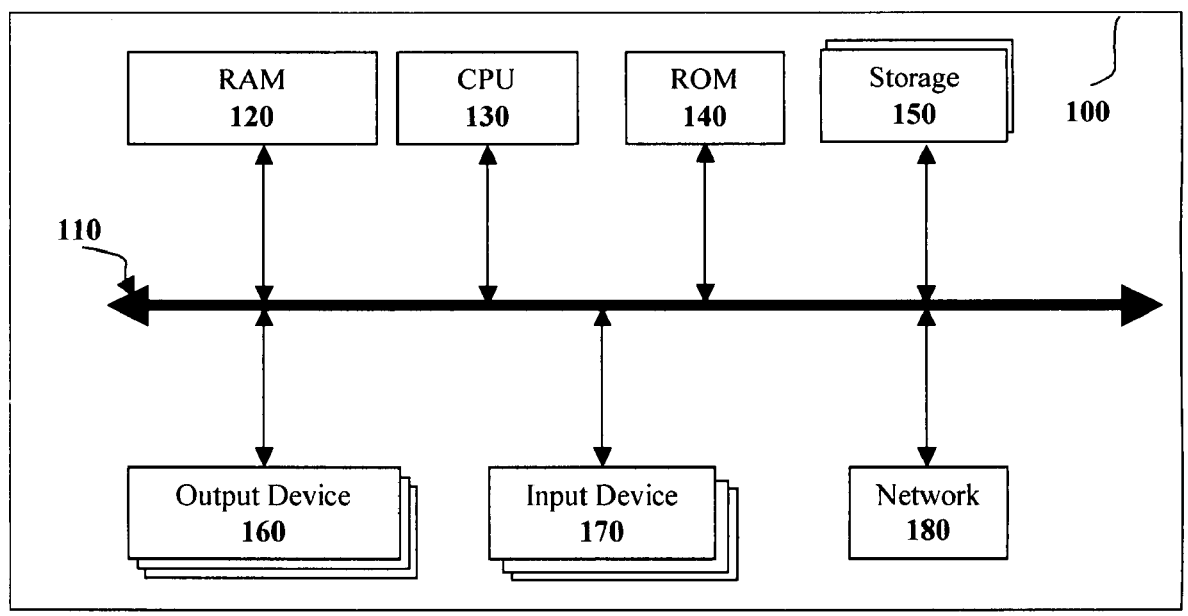
FIG. 1 illustrates a computing environment used in some embodiments of the present invention.

FIG. 1 illustrates a block diagram of the computing environment that one embodiment of the present invention is implemented. Even though the computer system is described with specific components and architecture for illustration, it should be understood that the present invention might be implemented in several other types of embodiments. For example, the invention can be implemented on single computer with a processor chip containing 2 or more processor cores with each core containing additional hardware to maintain state of two or more threads of execution. In addition, each component can be implemented as a combination of one or more of hardware, software and firmware, even though many features of the present invention are described herein as being implemented in software.

The computing environment 100 may contain one or more components such as a communication fabric 110, random access memory (RAM) 120, central processing unit (CPU) 130, read only memory 140 (ROM), secondary memory (Storage) 150, output devices 160, input Devices 170, network interface 180. All the components may communicate with each other over communication fabric 110. The communication fabric 110 collectively represents all systems, peripherals, chipset buses and all other communication pathways that can connect the components of the computing environment 100. The components of FIG. 1 are described below in further detail.

CPU 130 retrieves the instructions and data to process in order to execute the processes of this invention from the various storage components of computing environment 100. The ROM 140 stores the static instruction and data not modified during normal operation and are needed by CPU 130 and any other component of the computing environment 100. Read-write memory (RAM) 120 is a volatile storage that requires power to be supplied to store the instructions and data. Storage 150 is nonvolatile storage that doesn't need power to store instructions and data. In some embodiments, storage 150 use fixed mass-storage devices such as disk drives. Other embodiments use removal mass-storage devices such as removable disk drives. The RAM 120 stores some of the instructions and data that the CPU 130 needs. In some embodiments, the invention's processes are stored in the CPU 130, RAM 120, ROM 140, and/or storage 150.

The input device 170 enables the user to issue commands to the computing environment. Examples of an input device 170 include but are not limited to, keyboards, mouse, and/or tablet and stylus. The output device 160 is used to display images generate by the computing environment such as but not limited to the P&R layout and compacted layout.

Network interface 180 may be implemented using protocols such as TCP/IP, ATM and/or Ethernet. In this manner, the computer can be a part of a network of computers (such as a local area network ("LAN"), a wide area network ("WAN"), or an Intranet) or a network of networks (such as the Internet). Any, some or all of the components of computing environment 100 may, be used in conjunction with the invention. However, one of ordinary skill in the art would appreciate that any other system configuration may also be used in conjunction with the present invention.

As noted above, CPU 130 may retrieve the software instructions, and execute the instructions to provide various features of the present invention. The features of the present invention are described below in further detail.

General Flow

The present invention relates to a method and system consisting of a) physical design ("PD") process using simplified set of manufacturing rules during the generation of an IC layout, and b) layout optimization ("LO") process step to transform an PD generated layout to an optimized IC layout which is more manufacturing rule compliant with a minimal layout area impact.

One advantage of the present invention is that the probability of PD process successfully generating an IC layout is increased since the computational complexity of complying with a complete manufacturing rules is deferred so that a PD process can concentrate on the computationally difficult task of successfully generating an IC layout with a smaller layout area.

Figure 2:
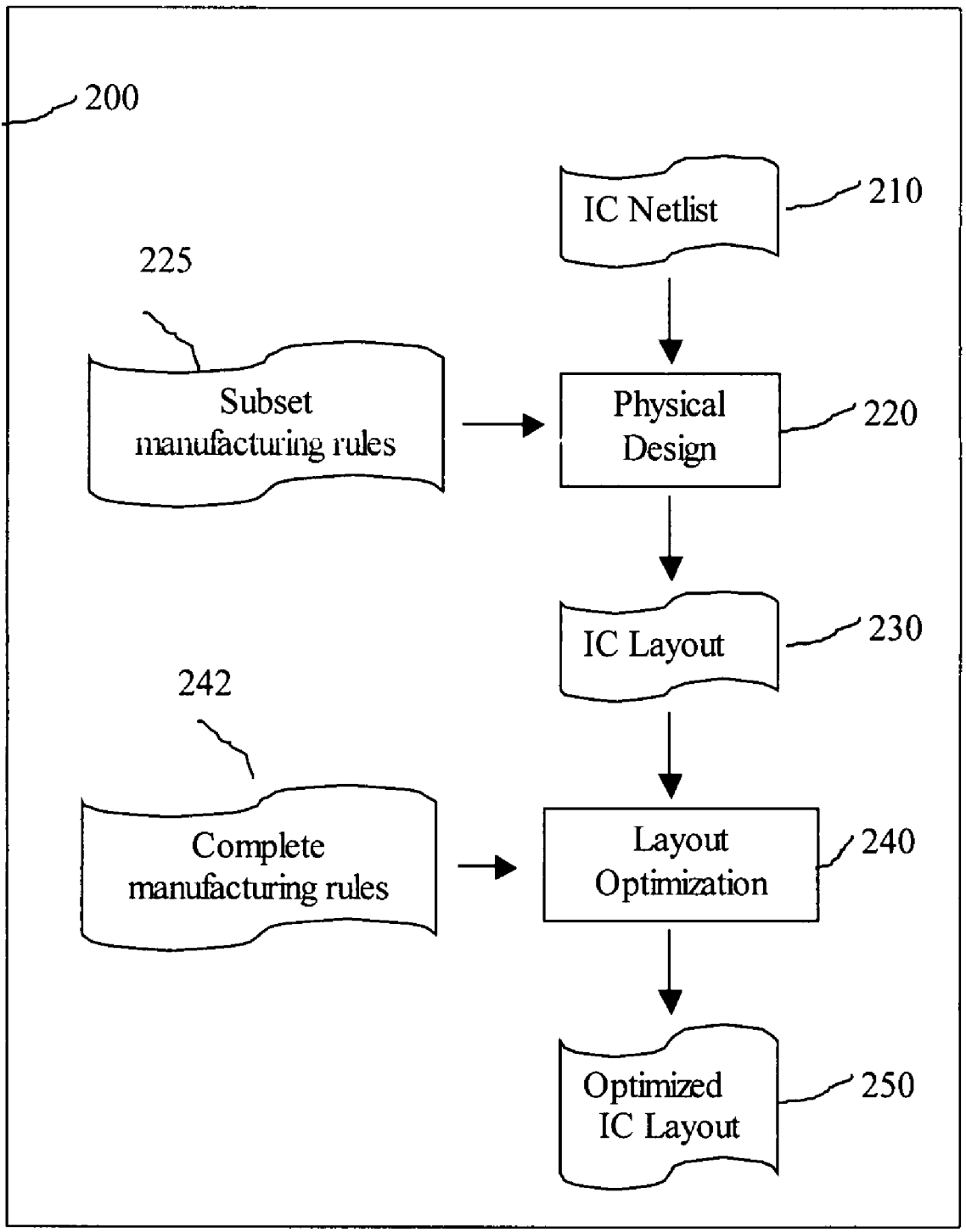
FIG. 2 illustrates a general process for some embodiments of the present invention.

FIG. 2 illustrates a process 200 for some embodiments of the present invention. The goal is generate an IC layout 250 which satisfies as many of manufacturing rules 242 as possible without incurring too much of layout area overhead and without overburdening the physical design process 220 with the complexity and difficulty of accounting for the complete set of manufacturing rules 242.

The process 200 first starts with a physical design process step 220 that takes as input an IC netlist 210 and produces an IC layout 230 that satisfies a subset of manufacturing rules 225. The physical design process step 220 typically entails one or more sub-process such as, but not limited to, creation of layout objects for each IC netlist components, placement of these layout objects, and creating the routing layout objects to connect component layout objects. Those skilled in the art will recognize there are several techniques to produce IC layout representation 230 from an IC netlist 210.

The process continues at the layout optimization process 240 that accepts a PD generated IC layout 230 as well as a complete manufacturing rules 242 and generates an optimized IC layout 250. The layout optimization process 240 produces an optimized layout 250 that is more desirable than the layout 230. In some embodiments, layout 250 is preferable to layout 230 since it has smaller layout area, which translates to lower manufacturing cost. In other embodiments, layout 250 satisfies more of manufacturing rules 242 and could result in higher percentage of a manufactured IC products meeting product requirements.

The layout optimization process 240 is an EDA application that manipulate shapes and positions of the layout objects subject to several restrictions such as, but not limited to, (1) satisfying manufacturing rules; (2) connectivity of layout objects as specified by a netlist; (3) component parameter requirements. There are several prior art detailing various approaches for the layout optimization process.

Figure 3:
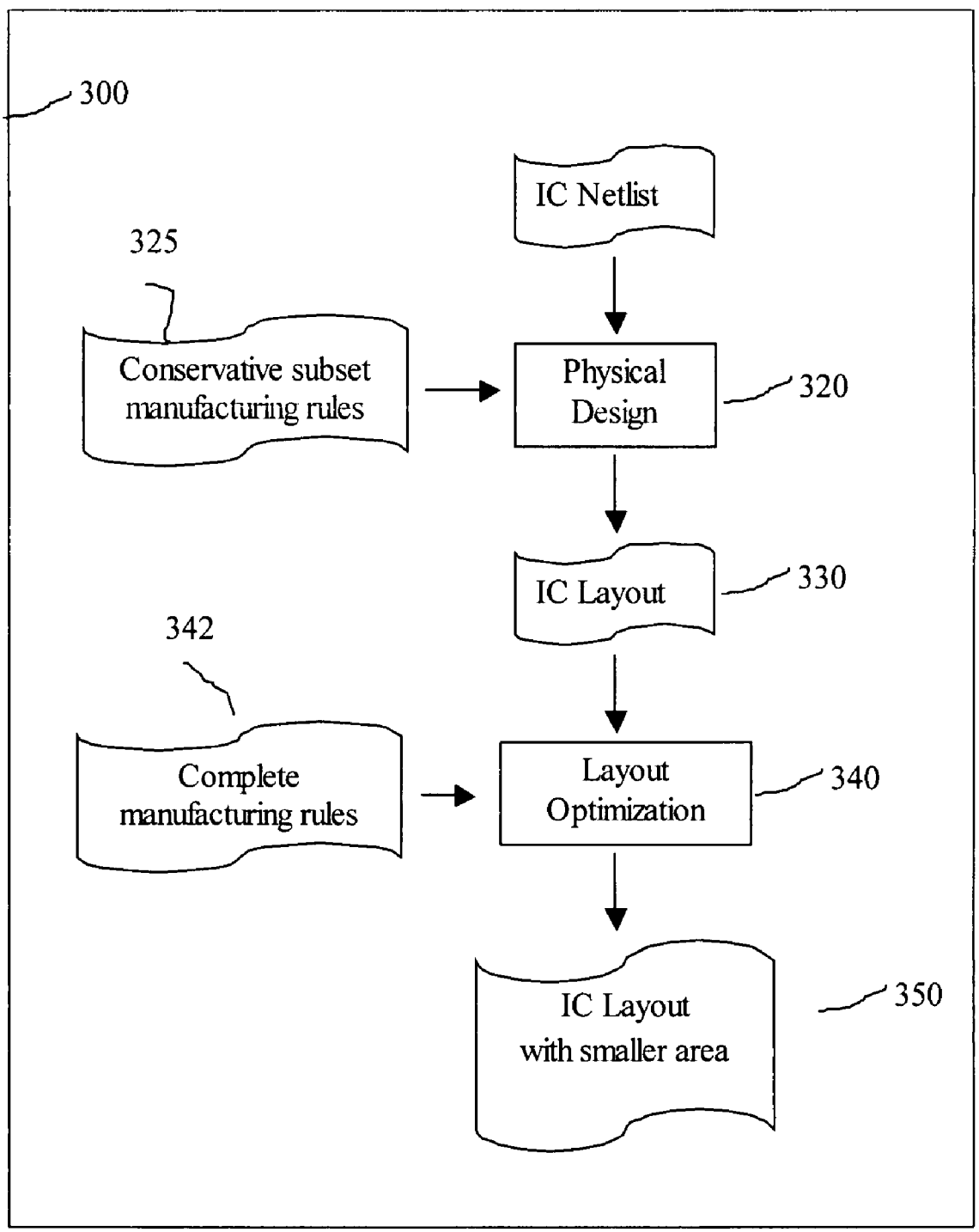
FIG. 3 illustrates a process for some embodiment of the present invention using a conservative subset of manufacturing rules.

FIG. 3 illustrates a process 300 for some embodiment where the physical design process 320 uses a conservative subset manufacturing rules 325. Using this conservative subset rules results in an IC layout 330 using more layout area than absolutely necessary to guarantee that it satisfies a complete manufacturing rules 342. Layout optimization process 340 reduces unnecessary layout areas from IC layout 330 to generate a layout 350 while satisfying manufacturing rules 342.

Figure 4:
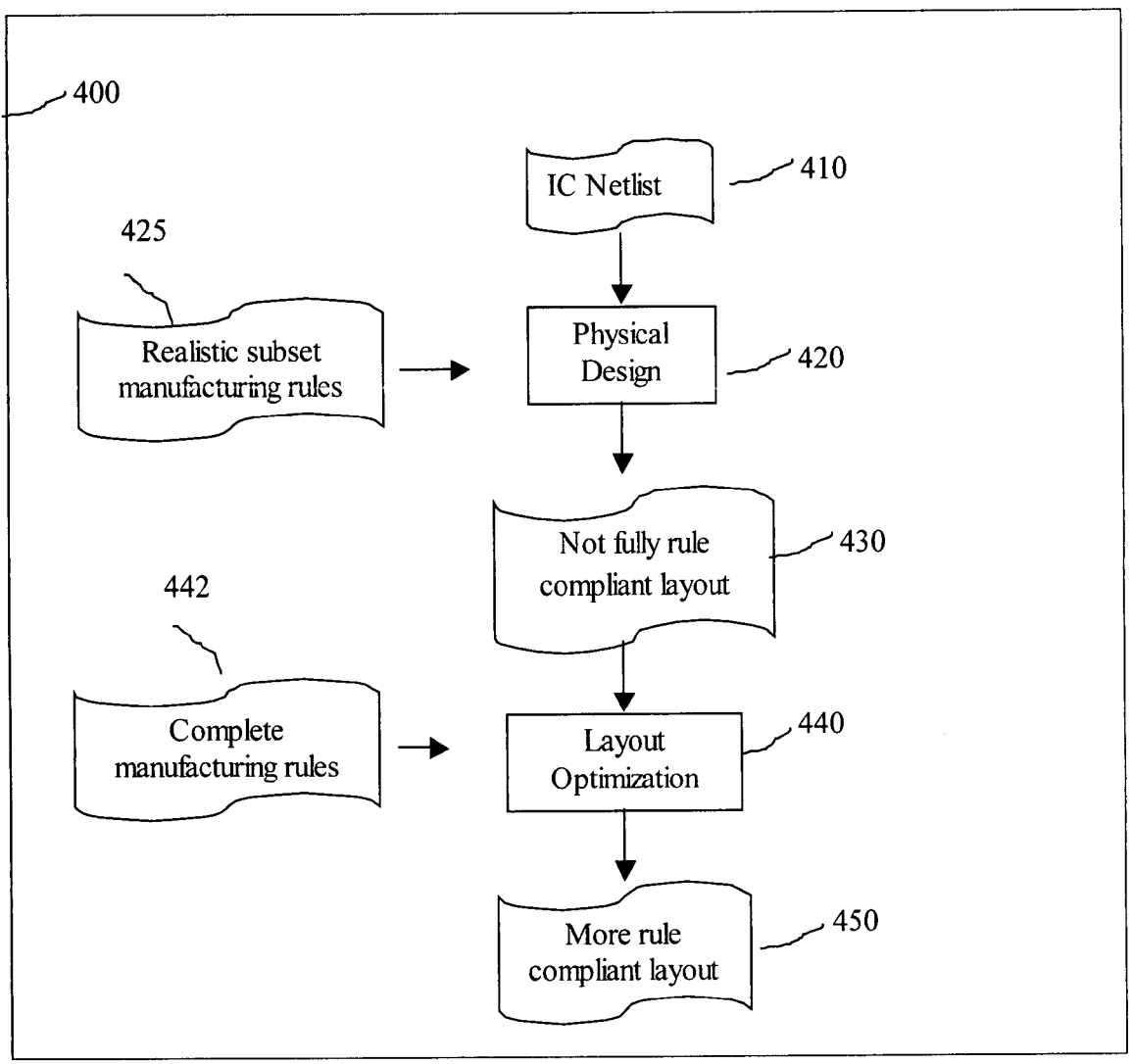
FIG. 4 illustrates a process for some embodiment of the present invention using a realistic subset of manufacturing rules.

FIG. 4 illustrates a process 400 for another embodiment of the present invention where the physical design process 425 uses a less pessimistic subset manufacturing rules 425 to generate a layout 430. The subset manufacturing rules 425 covers most but not all of the complete manufacturing rule set 442. As a result, the IC layout 430 doesn't satisfy all the requirements of complete manufacturing rules 442 for certain configurations of layout objects. The layout optimization process 440 transforms the manufacturing noncompliant layout 430 into the more manufacturing rule compliant layout 450 using the complete manufacturing rule 442. Since a layout conforming to more of manufacturing rules will have a higher yield, overall costs for a manufactured IC product will be lower.

Detailed Flow

For illustrative purposes, several example flows using both realistic and conservation subset manufacturing rules are presented below to demonstrate details of the present invention although one of skill in the art will realize that there are other equally valid variations of generating subset manufacturing rules.

Figure 5:
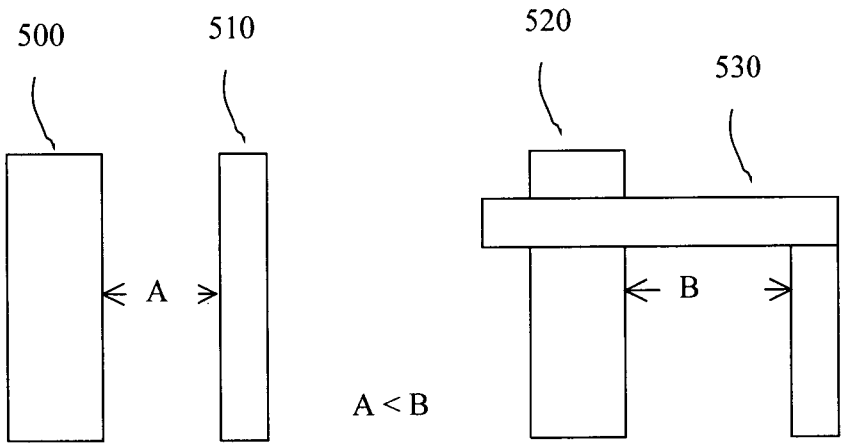
FIG. 5 illustrates manufacturing rules for spacing between two layout objects depending on a layout configuration.

FIG. 5 illustrates a set of manufacturing rules specifying different spacing requirements depending on surrounding neighboring layout objects. The manufacturing rule spacing is A for layout objects 500 and 510 and increases to B for configuration composed of layout objects 520 and 530. In some embodiments, spacing value B is required ("required") while in other embodiments spacing value B is an optional value ("recommended") whose use is recommended to increase the manufacturability of an IC layout.

In some embodiments of the present invention biased to be more conservative ("conservative"), a subset manufacturing rules will use larger spacing value B. This conservative strategy insures that PD generated layout will be fully compliant with manufacturing rules since the more pessimistic values are used; however, the generated IC layout's area could be larger since configurations requiring the smaller A spacing value will instead use the larger B values.

Figure 6:
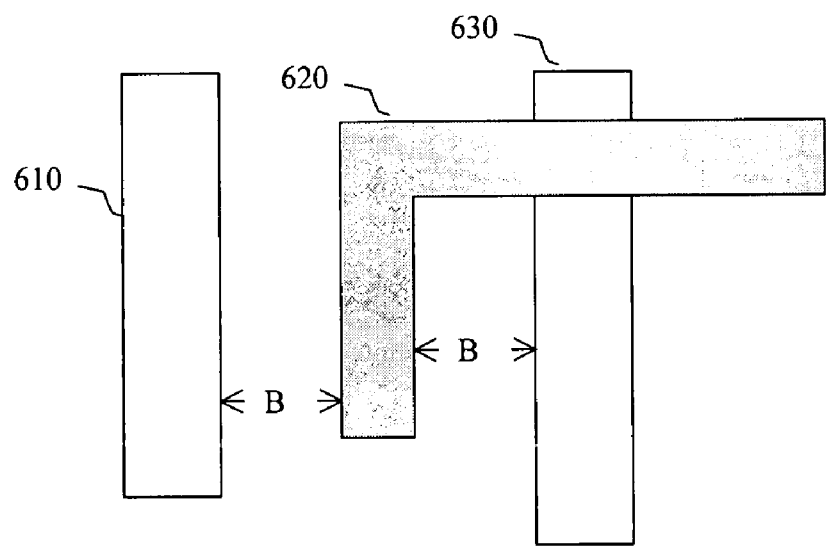
FIG. 6 illustrates an example of physical design generated IC layout resulting from process step 320 from the process 300 of FIG. 3.
Figure 7:
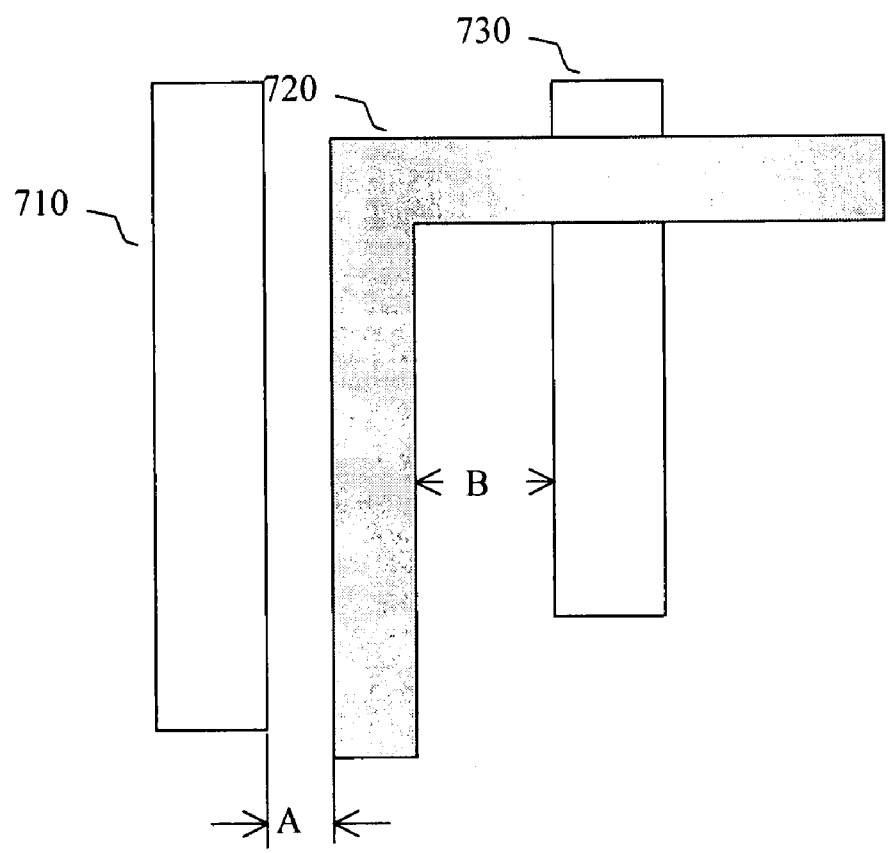
FIG. 7 illustrates an example of an optimized layout 350 of FIG. 3 using the example IC layout of FIG. 6.

The process 300 of FIG. 3 is one embodiment using the conservative manufacturing subset rules. The subset rule 325 would use a larger space value B so that a PD process 320 would generate an IC layout 330 using a spacing value B everywhere. FIG. 6 illustrates an example IC layout 330 where the larger spacing value B is used between layout objects 610 and 620 although manufacturing rules only specify smaller spacing value A. The layout optimization process 340 will accept this layout and a complete manufacturing rules 342 to generate an optimized layout 350 with spacing B reduced to spacing A. FIG. 7 illustrates an example of an optimized layout 350 where a smaller value B is used for the spacing between layout objects 710 and 720.

In other embodiments of the present invention biased to more realistic ("realistic"), a subset manufacturing rules will use smaller value A if the configuration of layout objects 520 and 530 is deemed to occur infrequently. The realistic strategy insures that a PD generated IC layout's area will be close to the minimum although some layout objects might not comply with some of the manufacturing rules.

Figure 8:
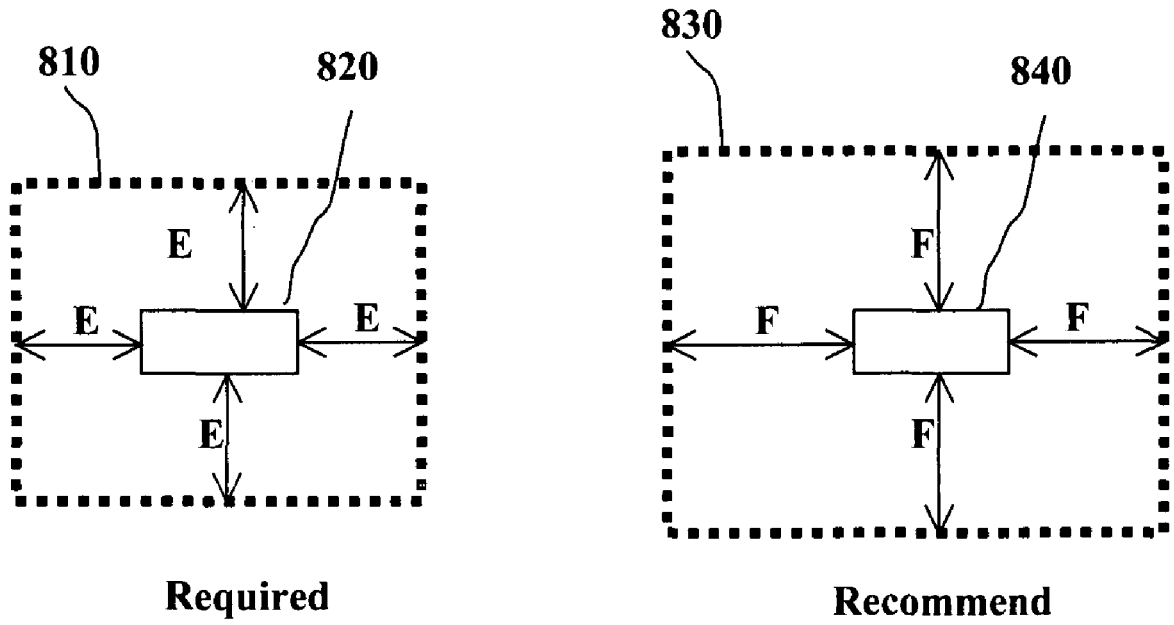
FIG. 8 illustrates manufacturing rules specifying required and recommended enclosure of layout objects by another layout objects.

FIG. 8 illustrates a manufacturing rule specifying the enclosure of geometry by that of another. The rule specifies that a layout object 820 be enclosed by layout object 810 at least E and that an enclosure value of F is recommended if space allows. Since one of the goals is to minimize layout area, the realistic process 400 of FIG. 4 would use a smaller enclosure value E during a PD process step 420 to generate an IC layout 430.

Figure 9:
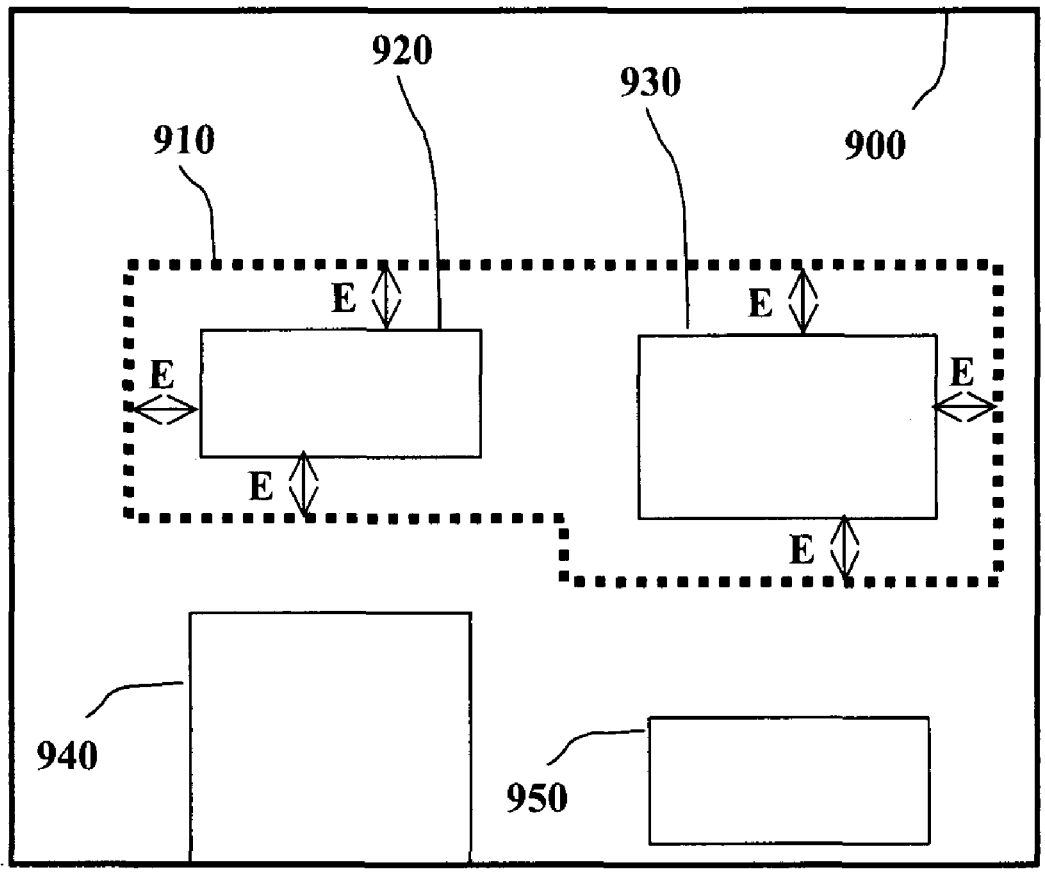
FIG. 9 illustrates an example of an IC layout 430 generated by some embodiment of a physical design process step 420 of process 400 in FIG. 4.
Figure 10:
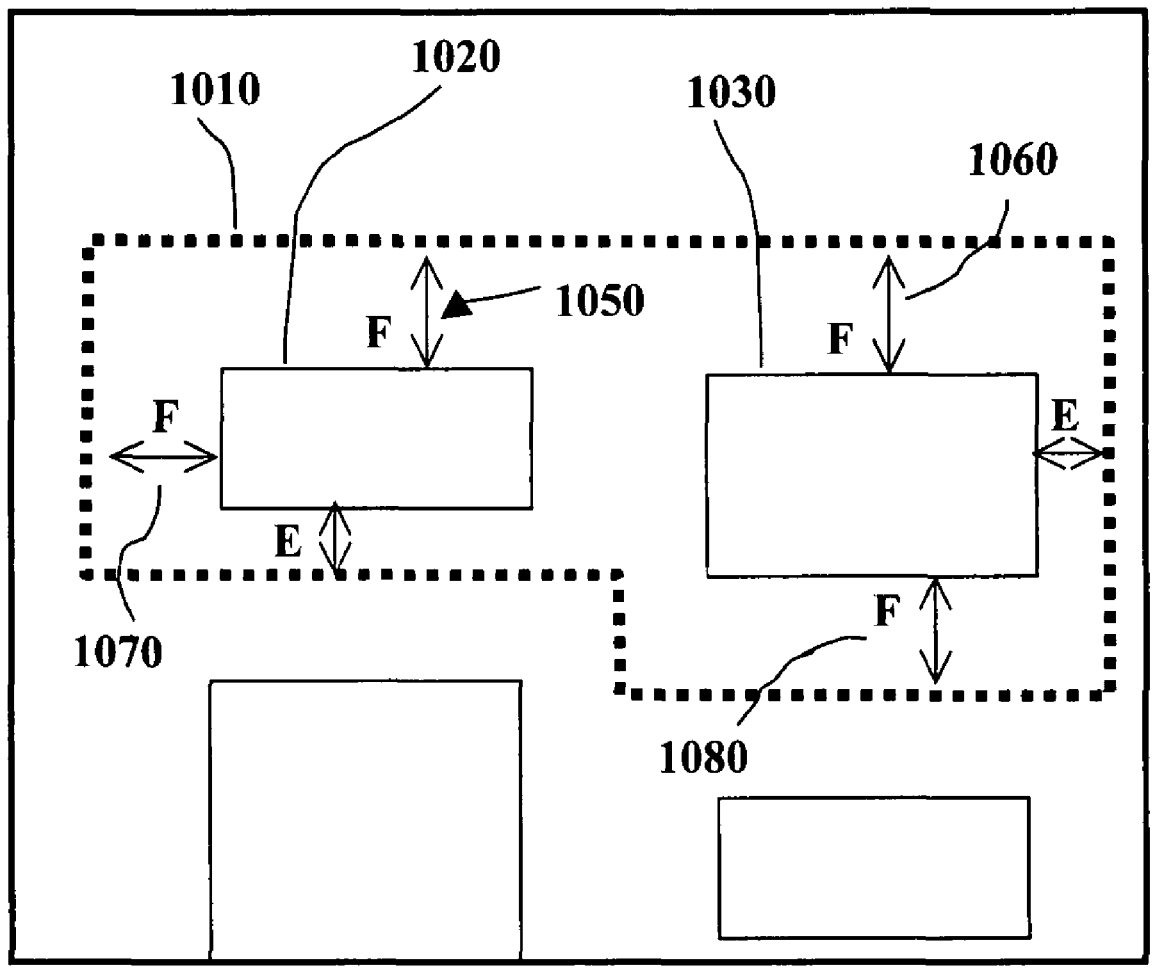
FIG. 10 illustrates an example of an optimized IC layout 450 from the process 400 of FIG. 4.

FIG. 9 illustrates an example of a "Not fully rule compliant layout" 430 of FIG. 4. Layout objects 920 and 930 are enclosed by layout object 910 with an enclosure value of E. Layout object 900 represents a fixed layout region that layout objects 910-950 must reside in. The layout optimization process 440 of FIG. 4 can adjust layout object 910 shape to increase the enclosure from E to F without increasing the layout area to create the optimized layout 450. FIG. 10 illustrates an example of an optimized layout generated by process 440. The larger enclosure values are enforced at 1050-1080.

Although the description above contains many specificities, these should be not be construed as limiting the scope of the present invention but merely providing illustrations of some of the presently preferred embodiments of this invention. For example, the standard cell layout fixed dimension can be in the x-direction rather than in the y-direction.

Thus the scope of the invention should be determined by the appended claims and their equivalents, rather than by the examples given.

We claim:

1. A method, executed by at least one processor of a computer, of generating an integrated circuit layout comprising:

generating a simplified subset of design and manufacturing rules from a complete set of design and manufacturing rules for the integrated circuit layout;

creating an integrated circuit layout which satisfies said simplified subset of design and manufacturing rules such that functionalities of said created integrated circuit layout does not depend on any attributes of said simplified subset of design and manufacturing rules for said created integrated circuit layout; and modifying said created integrated circuit layout to be compliant with the complete set of design and manufacturing rules without affecting any functionality of said created integrated circuit layout.

2. The method of claim 1 further comprising:

generating a conservative simplified subset of design and manufacturing rules from a complete set of design and manufacturing rules for the integrated circuit layout;

creating an integrated circuit layout which satisfies said conservative simplified subset of design and manufacturing rules such that functionalities of said created integrated circuit layout does not depend on any attributes of said conservative simplified subset of design and manufacturing rules for said created integrated circuit layout; and modifying said created integrated circuit layout to be compliant with the complete set of design and manufacturing rules without affecting any functionality of said created integrated circuit layout.

3. The method of claim 1 further comprising:

generating a realistic simplified subset of design and manufacturing rules from the complete set of design and manufacturing rules for the integrated circuit layout;

creating an integrated circuit layout which satisfies said realistic simplified subset of design and manufacturing rules such that functionalities of said created integrated circuit layout does not depend on any attributes of the realistic simplified subset of design and manufacturing rules for the said created integrated circuit layout; and modifying said created integrated circuit layout to be compliant with the complete set of design and manufacturing rules without affecting any functionality of said created integrated circuit layout.

4. One or more processor readable storage devices, tangibly embodying a program of instructions executable by one or more processors to perform a method in a system for of generating an integrated circuit layout comprising:

means of generating a simplified subset of design and manufacturing rules from a complete set of design and manufacturing rules for the integrated circuit layout;

means of creating an integrated circuit layout which satisfies said simplified subset of design and manufacturing rules such that functionalities of said created integrated circuit layout does not depend on any attributes of said simplified subset of design and manufacturing rules for said created integrated circuit layout; and means of modifying said created integrated circuit layout to be compliant with the complete set of design and manufacturing rules without affecting any functionality of said created integrated circuit layout.

5. One or more processor readable storage devices of claim 4 wherein the method further comprising:

means of generating a conservative simplified subset of design and manufacturing rules from a complete set of design and manufacturing rules for the integrated circuit layout;

means of creating an integrated circuit layout which satisfies said conservative simplified subset of design and manufacturing rules such that functionalities of said created integrated circuit layout does not depend on any attributes of said conservative simplified subset of design and manufacturing rules for said created integrated circuit layout; and means of modifying said created integrated circuit layout to be compliant with the complete set of design and manufacturing rules without affecting any functionality of said created integrated circuit layout.

6. One or more processor readable storage devices of claim 4 wherein the method further comprising:

means of generating a realistic simplified subset of design and manufacturing rules from the complete set of design and manufacturing rules for the integrated circuit layout;

means of creating an integrated circuit layout which satisfies said realistic simplified subset of design and manufacturing rules such that functionalities of said created integrated circuit layout does not depend on any attributes of the realistic simplified subset of design and manufacturing rules for the said created integrated circuit layout; and means of modifying said created integrated circuit layout to be compliant with the complete set of design and manufacturing rules without affecting any functionality of said created integrated circuit layout.

7. A system performing a process of generating an integrated circuit layout, the process comprising:

generating a simplified subset of design and manufacturing rules from a complete set of design and manufacturing rules for the integrated circuit layout;

creating an integrated circuit layout which satisfies said simplified subset of design and manufacturing rules such that functionalities of said created integrated circuit layout does not depend on any attributes of said simplified subset of design and manufacturing rules for said created integrated circuit layout; and modifying said created integrated circuit layout to be compliant with the complete set of design and manufacturing rules without affecting any functionality of said created integrated circuit layout.

8. The system as recited in claim 7 wherein the process further comprising:

generating a conservative simplified subset of design and manufacturing rules from a complete set of design and manufacturing rules for the integrated circuit layout;

creating an integrated circuit layout which satisfies said conservative simplified subset of design and manufacturing rules such that functionalities of said created integrated circuit layout does not depend on any attributes of said conservative simplified subset of design and manufacturing rules for said created integrated circuit layout; and modifying said created integrated circuit layout to be compliant with the complete set of design and manufacturing rules without affecting any functionality of said created integrated circuit layout.

9. The system as recited in claim 7 wherein the process further comprising:

generating a realistic simplified subset of design and manufacturing rules from the complete set of design and manufacturing rules for the integrated circuit layout;

creating an integrated circuit layout which satisfies said realistic simplified subset of design and manufacturing rules such that functionalities of said created integrated circuit layout does not depend on any attributes of the realistic simplified subset of design and manufacturing rules for the said created integrated circuit layout; and modifying said created integrated circuit layout to be compliant with the complete set of design and manufacturing rules without affecting any functionality of said created integrated circuit layout.

* * * * *